US007457655B2

(12) United States Patent
Welch et al.

(10) Patent No.: US 7,457,655 B2
(45) Date of Patent: Nov. 25, 2008

(54) MOTION CORRECTION OF MAGNETIC RESONANCE IMAGES USING MOMENTS OF SPATIAL PROJECTIONS

(75) Inventors: Edward Brian Welch, Rochester, MN (US); Armando Manduca, Rochester, MN (US)

(73) Assignee: Mayo Foundation For Medical Education and Research, Rochester, MN (US)

( * ) Notice: Subject to any disclaimer, the term of this patent is extended or adjusted under 35 U.S.C. 154(b) by 576 days.

(21) Appl. No.: 10/962,105

(22) Filed: Oct. 8, 2004

(65) Prior Publication Data

US 2006/0079754 A1    Apr. 13, 2006

(51) Int. Cl.
    *A61B 5/05*    (2006.01)
(52) U.S. Cl. ..................... 600/407; 600/410
(58) Field of Classification Search ............ 600/407, 600/410; 324/307, 309
    See application file for complete search history.

(56) References Cited

U.S. PATENT DOCUMENTS

| 4,731,583 | A | * | 3/1988 | Glover et al. ............ 324/309 |
| 4,858,128 | A | | 8/1989 | Nowak |
| 5,243,284 | A | | 9/1993 | Noll |
| 5,833,609 | A | * | 11/1998 | Dannels et al. ........... 600/410 |
| 5,850,486 | A | * | 12/1998 | Maas et al. .............. 382/294 |
| 5,946,425 | A | | 8/1999 | Bove, Jr. et al. |
| 6,031,374 | A | * | 2/2000 | Epstein et al. ........... 324/306 |
| 6,192,265 | B1 | | 2/2001 | Carlsen et al. |
| 6,404,196 | B1 | | 6/2002 | Duerk et al. |
| 2004/0004476 | A1 | * | 1/2004 | Overall ................... 324/309 |
| 2004/0113613 | A1 | * | 6/2004 | Markl et al. ............. 324/306 |

OTHER PUBLICATIONS

G.H. Clover et al., Projectin Reconstruction Techniques for Reduction of Motion Effects in MRI, Mag. Reson. in Med. 28, 275-289 (1992).

(Continued)

*Primary Examiner*—Brian L. Casler
*Assistant Examiner*—Ellsworth Weatherby
(74) *Attorney, Agent, or Firm*—Quarles & Brady LLP

(57) ABSTRACT

Magnetic resonance images reconstructed from a radial/projection acquisition are corrected for motion corruption caused by in-plane translational and in-plane rotational motion of an imaged subject using only the projection data itself. The method is based on the consistency properties of the $0^{th}$, $1^{st}$, and $2^{nd}$ order moments of the spatial domain projections. In-plane translational motion is corrected by shifting/aligning the spatial projections according to the center of mass of each projection, which is calculated using the $0^{th}$ and $1^{st}$ moments. In-plane rotational motion is accounted for by determining the rotational motion time record using the $2^{nd}$ moment information. The determination of the rotational motion time record using the $2^{nd}$ moments is made possible by acquiring the successive MR projections at a view angle spacing that is substantially 45° and thus achieves sufficient linear independence. The translation-corrected spatial projections are reconstructed using the actual projection view angles, which are sum of the intended projection view angles plus the detected in-plane rotational motion time record. The calculation may also be performed in real-time during data acquisition in order to reacquire projections found to be too inconsistent due to through plane motion or other changes that are not in-plane rigid body motions or to acquire projections determined to be missing from the data set due to rotational motion.

12 Claims, 6 Drawing Sheets

OTHER PUBLICATIONS

Gary H. Glover, et al., Consistent Projection Reconstruction (CPR) Techniques, MRM 29:345-351 (1993).

Neville Gai et al., Correction of Motion Artifacts in Linogram and Projection Reconstruction MRI Using Geometry and Consistency Constraints, Med. Phys 23(2), Feb. 1996.

Volker Rasche et al., Continuous Radial Data Acquisition For Dynamic MRI, MRM 34:754-761 (1995).

Tobias Schaffter et al., Motion Compensated Projection Reconstruction, Mag. Reson. In Med. 41:954-963 (1999).

James G. Pipe, Motion Correction With Propeller MRI: Application To Head Motion and Free-Breathing Cardiac Imaging, Mag. Reson in Med. 42:963-969 (1999).

Ajit Shankaranarayanan, et al., Two-Step Navigatorless Correctin Algorithm For Radial k-Space MRI Acquisition, Mag. Reson in Med. 45:277-288 (2001).

* cited by examiner

MOTION CORRECTION OF MAGNETIC RESONANCE IMAGES USING MOMENTS OF SPATIAL PROJECTIONS

STATEMENT REGARDING FEDERALLY SPONSORED RESEARCH

This invention was made with government support under Grant No. EB00229 awarded by the National Institute of Health. The United States Government has certain rights in this invention.

BACKGROUND OF THE INVENTION

The field of the invention is magnetic resonance imaging ("MRI") methods and systems and more particularly a method and apparatus for acquiring MRI data using a radial, or projection reconstruction, acquisition and correcting for in plane subject motion.

When a substance such as human tissue is subjected to a uniform magnetic field (polarizing field $B_0$) the individual nuclei in the tissue attempt to align their magnetic moments with this polarizing field but as a result of nuclear spin, precess about it in random order at their characteristic Larmor frequency. The Larmor frequency is dependent on the strength of the magnetic field and on the properties of a particular nucleus as represented by a magnetogyric constant $\gamma$. Nuclei which exhibit this phenomenon are referred to as "spins".

By convention, the polarizing field $B_0$ is considered to lie along a z axis of a Cartesian coordinate system. The precession of the nuclei in the polarizing field $B_0$ creates a net magnetic moment $M_z$ in the direction of the polarizing field. Individual spins have magnetic moments that are perpendicular to the z axis in the transverse or x-y plane, however, the random orientation of the spins cancels any net transverse magnetic moment. In MRI imaging, a radio frequency signal is applied in the x-y plane near the Larmor frequency to tip the net magnetic moment into the x-y plane so that it rotates at the Larmor frequency. The practical value of this phenomenon resides in the signal which is then emitted by the excited spins termed the NMR signal ("nuclear magnetic resonance").

An image of a patient may be obtained by evaluating the NMR signal contributed by different spins at different locations in the patient's tissue. A pulse sequence using gradient magnetic fields encodes location information on the spins in the form of the phase and frequency. The encoded spin signal may then be separated to produce an image. The pulse sequences most commonly found in clinical applications are so-called Cartesian, or Fourier, pulse sequences in that the phase encoding and frequency encoding gradient axes are orthogonal and each NMR signal sample is viewed as a sample from a row and column in Cartesian k-space.

A wide variety of such Cartesian pulse sequences is known. For example, the spin warp or spin echo technique is described in "Spin Warp NMR Imaging And Applications To Human Whole-Body Imaging" by W. A. Edelstein et al., Physics in Medicine and Biology, vol. 25, pp. 751-756 (1980); the steady state free precession ("SSFP") technique including gradient refocused acquired steady state pulse sequences ("GRASS") as described in U.S. Pat. No. 4,665,365 and contrast enhanced fast imaging (SSP-ECHO) described in "Rapid Fourier Imaging Using Steady State Free Precision", R. C. Hawks and S. Patz, Magnetic Resonance in Medicine 4, pp. 9-23 (1987); and echo planer imaging ("EPI") is described in an article by Peter Mansfield (J. Phys. C. 10: L55-L58, 1977). After the NMR signals are acquired, an image is reconstructed using a 2D or 3D Fourier transformation.

In more recent years an alternative method of data acquisition that had fallen out of favor is being used more widely in which the k-space data is filled not by rows and columns but by a series of radial projections about a point within k-space. This acquisition technique is analogous to the acquisition of data in an x-ray computed tomography ("CT") machine and allows the data to be reconstructed into an image by CT-type algorithms including filtered back projection. This is known as a radial acquisition and is sometimes referred to as a projection reconstruction method. In fact, it was the method by which the first MR images were acquired and reconstructed by Paul C. Lauterbur in 1973. Such radial acquisition methods are disclosed, for example, in U.S. Pat. Nos. 6,630,828; and 6,188,922.

MRI acquisitions using a radial sampling trajectory and projection reconstruction ("PR") are known to have intrinsic advantages over two-dimensional Fourier transform (2DFT) acquisitions when imaging a moving object. Motion artifacts in PR acquisitions manifest as radial streaks perpendicular to the direction of motion with diminished amplitude near the moving object. In 2DFT approaches, motion often creates ghosts in one direction with strongest intensity near the source of movement. Because of the improved motion characteristics of PR methods as well as other properties, interest in PR has increased recently for applications such as high-speed 3D imaging, MR angiography, dynamic imaging and fluoroscopy, catheter tracking and reduced field of view (FOV) imaging.

Many techniques have been proposed to further improve the robustness of PR against motion artifacts. Some techniques simply try to minimize the effect of motion with approaches such as respiratory ordered view angles (analogous to respiratory ordered phase encoding used in conjunction with 2DFT imaging) or with fast scanning. Other techniques impose consistency constraints on the PR data to reject or filter out inconsistent data (Glover G H, Noll D C, "Consistent Projection Reconstruction (CPR) Techniques For MRI," Magn Reson Med 1993;29:345-351.) or to resort (Gai N, Axel L., "Correction Of Motion Artifacts In Linogram And Projection Reconstruction MRI Using Geometry And Consistency Constraints," Med Phys 1996;23:251-262.). Others attempt to correct directly for the effect of translation by shifting projections by their centers of mass as described by Shankaranarayanan A, Wendt M, Lewin J S, Duerk J L, "Two-step Navigatorless Correction Algorithm For Radial k-Space MRI Acquisitions," Magn. Reson. Med. 2001; 45(2):277-288, or correct translation and rotation by registering low resolution interleaved acquisitions as described by Schäffter T, Rasche V, Carlsen I C, "Motion Compensated Projection Reconstruction," 1999;41(5):954-63.

While such prior "navigatorless" methods correct directly for in-plane translational motion of the subject during the scan, none directly detect subject rotation. Many subjects of clinical importance have complicated movements which include rotation, and correction for such movements is highly desirable. The approach by Gai and Axel attempts to resort projections to partially compensate for limited rotations occurring in the monotonic segments of the 2nd moment trajectory versus projection view angle. However, it has not previously been realized that the consistency properties of the 2nd moments of the spatial projections in radial MRI in conjunction with a specific projection angle acquisition time order can be used to directly detect unlimited in-plane rotation occurring at any point during the imaging acquisition.

SUMMARY OF THE INVENTION

The present invention is a method for acquiring MRI data using a PR method such that the acquired PR data can be examined and processed to correct for both in-plane subject translational motion and rotational motion. The view order of the PR acquisition is modified such that the projection angle between successively acquired projections during the scan is substantially 45 degrees. The acquired projections are Fourier transformed and translational and rotational corrections are calculated by examining their $0^{th}$, $1^{st}$ and $2^{nd}$ order moments A general object of the invention is to correct for in-plane translational and rotational subject motion without the need for acquiring additional navigator NMR signals. Other than a modification in the order in which each projection is acquired, there is no need to change the PR pulse sequence or add a periodic navigator pulse sequence to the scan. Sufficient information is contained in the moments of the acquired projections to make the corrections.

Another object of the invention is to correct projections for patient motion in real time as they are acquired. Correction can be made according to the present invention using less than a complete projection data set. That is, acquired projections are corrected based on information contained in the previously acquired projections.

GENERAL DESCRIPTION OF THE INVENTION

Figure 2:
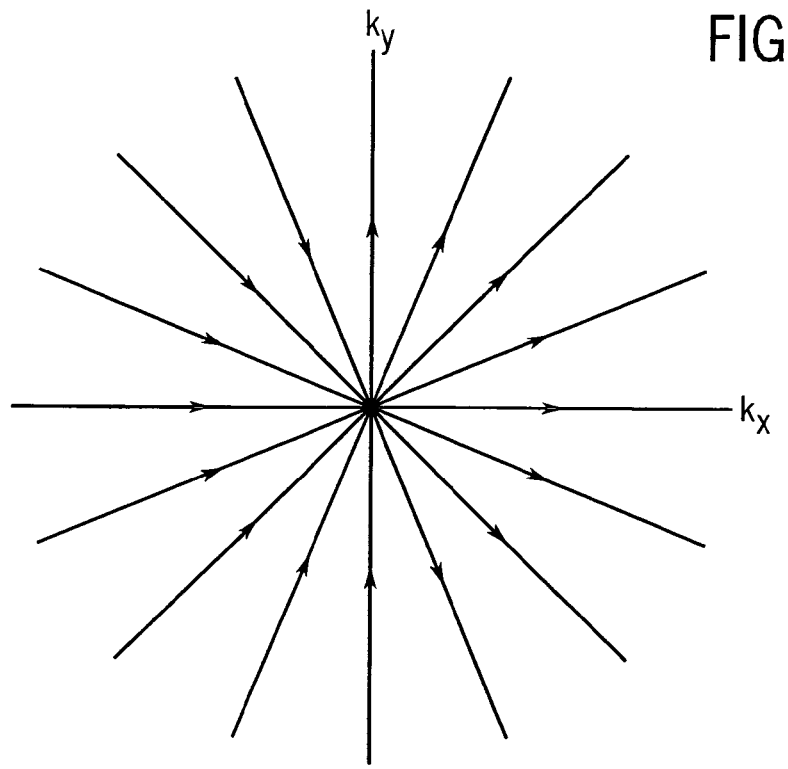
FIG. 2 is a graphic illustration of the manner in which k-space is sampled during a typical 2D PR image acquisition using the MRI system of FIG. 1
Figure 3:
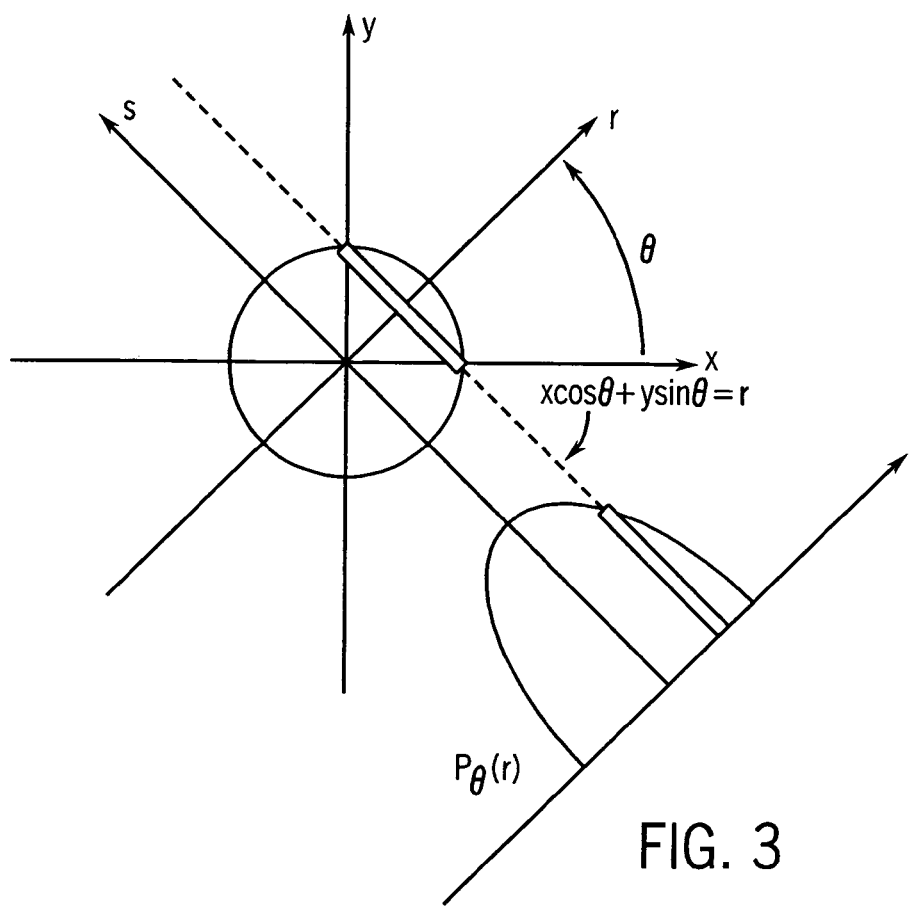
FIG. 3 is a graphic representation of a projection view acquired at a projection angle θ.

In radial MRI, the k-space data acquisition trajectory is comprised of lines crossing the center of k-space at various angles (θ) with respect to $k_x$ axis as shown in FIG. 2. By sampling k-space substantially uniformly with such radial sampling trajectories, sufficient information is acquired to reconstruct an accurate image. According to the Fourier central slice theorem, each angular "spoke" in k-space is equivalent to the Fourier transform of the spatial domain projection of the imaged object at that same projection view angle θ. The 2D spatial projection $p_θ$ of the imaged object at a certain view angle θ is expressed mathematically by $$p_θ(r) = \int_{s(r)} f(x,y) ds \qquad (1)$$

where s(r) defines a ray path at the projection angle θ on the locus of points satisfying $$x \cos(θ) + y \sin(θ) = r \qquad (2)$$

as depicted in FIG. 3. Acquiring diagonals of k-space over the range of projection angles from 0° to 180° yields the Fourier transform of the imaged object's Radon transform in (r,θ) space. The set of spatial domain projections across a number of equally spaced projection angles is also known as the object's sinogram because features traverse sinusoidal trajectories in the θ direction.

The $n^{th}$ statistical moment $Q_n$ of any spatial projection $p_θ(r)$ in the sinogram of a static object must obey certain consistency requirements. Moments vary with the projection angle according to $$Q_n(θ) = \int_R p_θ(r) r^n dr \qquad (3)$$
$$= \int_R f(x,y)(x\cos θ + y\sin θ)^n dx dy.$$

For an ideal static object, the $0^{th}$ moment (total sum of a projection) is constant and independent of projection angle. Inconsistencies observed in the $0^{th}$ moments, caused by through-plane motion or other effects, may be used to reject a certain projection and eliminate it completely from the image reconstruction process. It has long been known that higher order moments are functions of the projection angle bandlimited in the θ variation by nθ as reported by Glover G H, Noll D C, "Consistent Projection Reconstruction (CPR) Techniques For MRI," Magn Reson Med 1993;29:345-351. The $1^{st}$ moment can be represented by $$Q_1(θ) = \sqrt{A_1^2 + B_1^2} \sin\left(θ + \tan^{-1}\left(\frac{B_1}{A_1}\right)\right) \qquad (4)$$

which is simply a single sinusoid of frequency θ centered about zero with amplitude and phase dependent on the constants $A_1$ and $B_1$ that are related to the geometry of the imaged object. Similarly, from trigonometric identities, the $2^{nd}$ moment can be shown to be $$Q_2(θ) = \sqrt{A_2^2 + B_2^2} \sin\left(2θ + \tan^{-1}\left(\frac{B_2}{A_2}\right)\right) + C_2 \qquad (5)$$

which is not just bandlimited by 2θ, but is a single sinusoid of frequency 2θ. The constants $A_2$, $B_2$ and $C_2$ are dependent on the object's geometry.

In-plane motion causes reversible or detectable inconsistencies in the $1^{st}$ and $2^{nd}$ moment trajectories, and projections with such inconsistencies may be corrected. For example, the $1^{st}$ moment $Q_1(θ)$ is directly proportional to the trajectory of the imaged object's center of mass. If 2D in-plane translation occurs between the acquisitions of two projections, the center of mass, $Q_1(θ)|Q_0(θ)$, of the later projection is shifted by the component of the translational motion that is perpendicular to its integral (ray sum) direction. If the $1^{st}$ moment of each projection is plotted versus θ, an inconsistency in the sinusoidal trajectory will appear at the projection angle after which the translation occurred. An image reconstructed from such a set of projections would exhibit motion artifacts. However, if each projection is shifted to align its center of mass to a reference position, e.g., the center of the FOV, as in Eq. (6), the inconsistency and reconstruction artifacts caused by the translation will be eliminated.

$$\hat{p}_\theta(r) = p_\theta\left(r - \frac{Q_1(\theta)}{Q_0(\theta)}\right) \quad (6)$$

Figure 6:
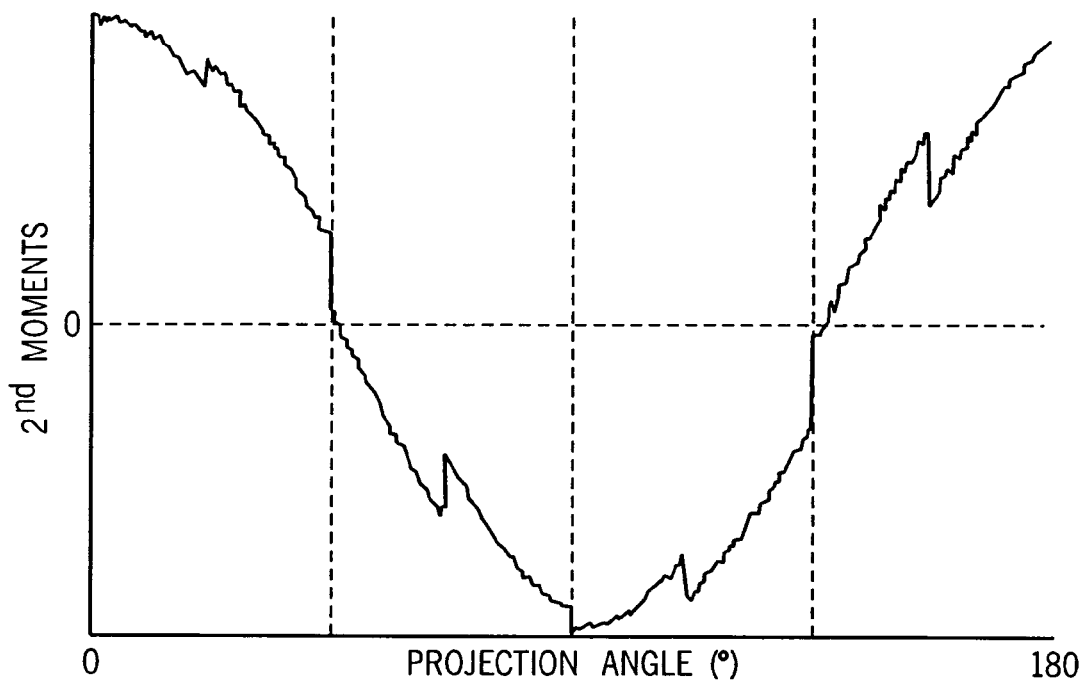
FIG. 6 is a graph which illustrates a second moment trajectory produced by the method of FIG. 5.

In-plane rotation causes a projection to be acquired at a view angle different from the desired angle. Therefore, an inconsistency will be observed in the $2^{nd}$ moment trajectory of the aligned (translation corrected) projections if an in-plane rotation occurs between the acquisitions of two projections. If the waveform parameters of the sinusoidal trajectory in Eq. (5) are known, an inverse sine operation can map a given $2^{nd}$ moment to the actual acquired view angle. In practice, however, this process is difficult because the properties of the ideal sinusoidal trajectory are not known, the inversion using an arcsine operation is inaccurate near the peaks of the sine wave, and a single $2^{nd}$ moment value maps to two distinct points on the sinusoid. Therefore, we acquire the projection angles through time in a time acquisition order that samples the $2^{nd}$ moment trajectory in a manner that will allow for the robust detection of rotational motion. Such a $2^{nd}$ moment trajectory is shown in FIG. 6, where the discontinuities in the sinusoidal waveform are caused by subject rotation.

To derive the view angle acquisition order that will best invert the $2^{nd}$ moment trajectory of the shifted projections to the actual acquired projection angles, we begin by incorporating the possible in-plane rotational motion of the imaged object into the following discrete expression for the trajectory of the $2^{nd}$ moment of the aligned projections.

$$\hat{Q}_2(\theta[n]) = A\sin(2(\theta[n] + \alpha[n]) + B) + C \quad (7a)$$

$$= A\sin(2\alpha[n] + B)\cos(2\theta[n]) + A\cos(2\alpha[n] + B)\sin(2\theta[n]) + C \quad (7b)$$

Here $\theta[n]$ is the $n^{th}$ acquired projection angle, $\alpha[n]$ is the additional in-plane rotational displacement of the imaged object at the time of acquisition of the $n^{th}$ projection, and A, B and C are object dependent constants. $\hat{Q}_2(\theta[n])$ are the $2^{nd}$ moments of the aligned projections $\hat{p}_\theta(r)$ after the operation described by Eq. (6). Solving the form stated in Eq. (7a) with the sum of the known projection view angles, $\theta[n]$, and unknown rotational motion angles, $\alpha[n]$, within the same argument to a single sinusoidal term would require non-linear methods. In principle, non-linear methods could be used to solve the system of equations and determine the unknown rotational motion. We illustrate one approach in the preferred embodiment to solve this system based on reducing it to a set of linear equations in conjunction with a certain projection view angle acquisition time order that makes the process of solving the linear equations mathematically well posed.

The equation can be expressed in an alternate form, Eq. (7b). Using a trigonometric sum of angles identity, the single sinusoid can be expanded into two terms with factors involving the known projection angles and rotational motion separately. This form is also non-linear with respect to $\alpha[n]$, but it is linear with respect to separate sine and cosine terms dependent on $\alpha[n]$. The $\cos(2\theta[n])$ and $\sin(2\theta[n])$ values are known, and using this form, a system of linear equations can express the relationship between the measured $2^{nd}$ moments of the shifted projections and the sine and cosine values of the unknown rotation angles. Unfortunately, there are only $N_\theta$ such equations and $2N_\theta$ unknown sine and cosine terms. Although the properties of sine and cosine allow one value to be expressed in terms of the other with the familiar identity $\sin^2+\cos^2=1$, this constraint is non-linear and is incompatible with least squares inversion. Instead, additional assumptions are made to increase the number of equations to make the system linearly invertible.

Here we assume the rotational motion varies slowly such that $\alpha[n]\approx\alpha[n+1]$ and $\alpha[n]\approx\alpha[n-1]$. A step rotation violates these assumptions, but a least squares inversion of the resulting equations will nevertheless yield a rotational motion record that approximates the step motion. Though the additional assumptions yield another $2N_\theta$ equation for a total of $3N_\theta$ equations, the linear system may not be well posed with high enough rank to be inverted. The system of equations involving the unknown in-plane rotational motions $\alpha[n]$ and the known projection view angles $\theta[n]$ in the relationship expressed by Eq. (7) is well posed when equations involving $\alpha[n-1]$, $\alpha[n]$ and $\alpha[n+1]$ are orthogonal or approximately orthogonal. Such orthogonality, or linear independence, is maximized when the cosine and sine terms involving $\theta[n]$ in Eq. (7) satisfy the following relationship for $\theta[n]$ and $\theta[n+1]$.

$$\cos(2\theta[n])\approx\sin(2\theta[n+1])\approx\cos(2\theta[n+1]-90°) \quad (8a)$$

$$\sin(2\theta[n])\approx\cos(2\theta[n+1])\approx\sin(2\theta[n+1]+90°) \quad (8b)$$

Therefore, the system will be well posed when projection angles adjacent in the time order of acquisition are spaced by approximately 45° as stated in Eq. (9).

$$\theta[n+1]\approx\theta[n]\pm45° \quad (9)$$

Figure 7:
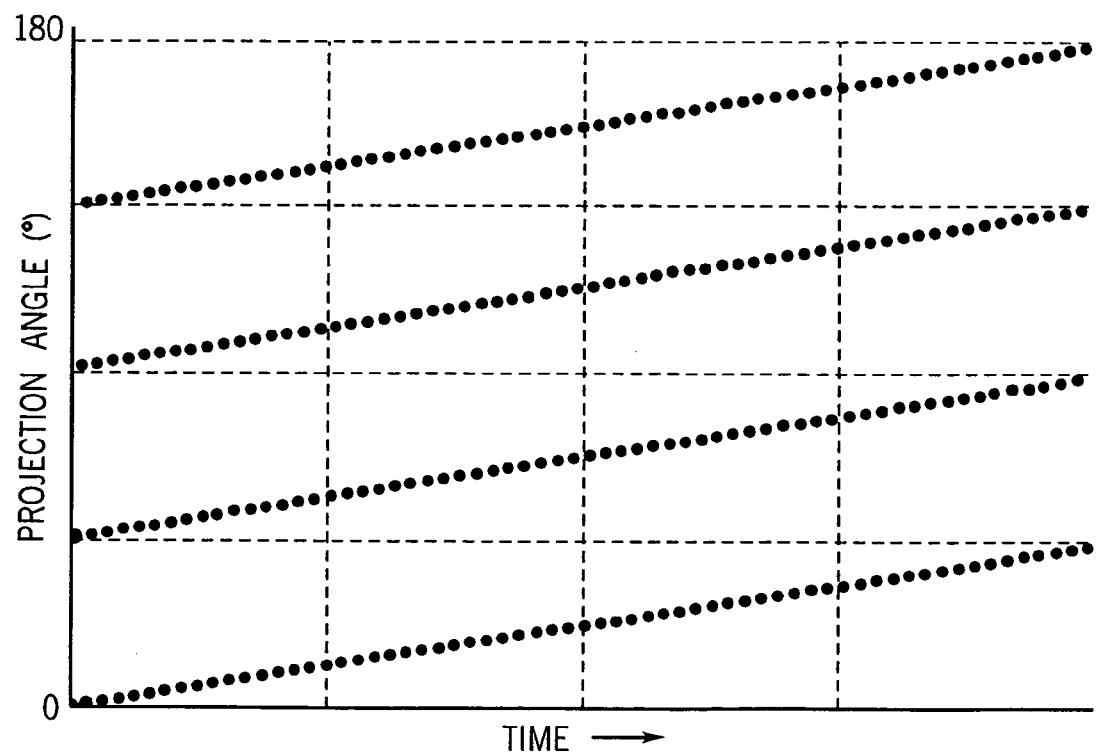
FIG. 7 is a graphic illustration of the preferred angle order for use when practicing the present invention.

Projection view angles in the time order described by $$\theta[n] = 45°(n(\bmod 4)) + \left(\frac{180°}{N_\theta}\right)\left\lfloor\frac{n}{4}\right\rfloor \quad n = 0, 1, \ldots, N_\theta - 1 \quad (10)$$

where $N_\theta$ is the number of acquired projections, n(mod4) represents n modulo 4, and $\lfloor\ \rfloor$ is the floor function (returns the largest integer value less than or equal to the input) are acquired with such a 45° spacing (as closely as possible) throughout the acquisition and are plotted in FIG. 7. As an intuitive motivation for the 45° spacing, consider that position along a sinusoid can be unambiguously determined from two values that are known to be 90° apart along the wave. A 45° spacing between projection view angles samples the $2^{nd}$ moment's sinusoidal trajectory at an angular spacing of 90° because the $2^{nd}$ moment trajectory has a frequency of twice the projection view angle.

Using this view angle acquisition order, the results from solving the overdetermined system of equations with a least squares inversion can be converted into the actual rotational angles according to $$\alpha[n] = \frac{1}{2}\tan^{-1}\left(\frac{A\sin(2\alpha[n]+B)}{A\cos(2\alpha[n]+B)}\right) \quad (11a)$$

$$\alpha'[n] = \alpha[n] - \alpha[0] \quad (11b)$$

where $\tan^{-1}$ refers in this case to the four quadrant inverse tangent function ranging from −180° to 180°. The subtraction of α[0] in Eq. (11b) references the applied correction angles α'[n] to zero rotation for the initial view collected at the beginning of the acquisition. The object dependent constant A cancels out in the arctangent operation, and the object constant B is irrelevant once the initial rotational displacement is set to zero. The object dependent constant C is added as an additional unknown in the least squares inversion. The detected rotational motion angles are then added to the nominal projection angles to obtain the actual acquired projection angles for use in the reconstruction of the aligned (translation corrected) projections.

DETAILED DESCRIPTION OF THE PREFERRED EMBODIMENT

Figure 1:
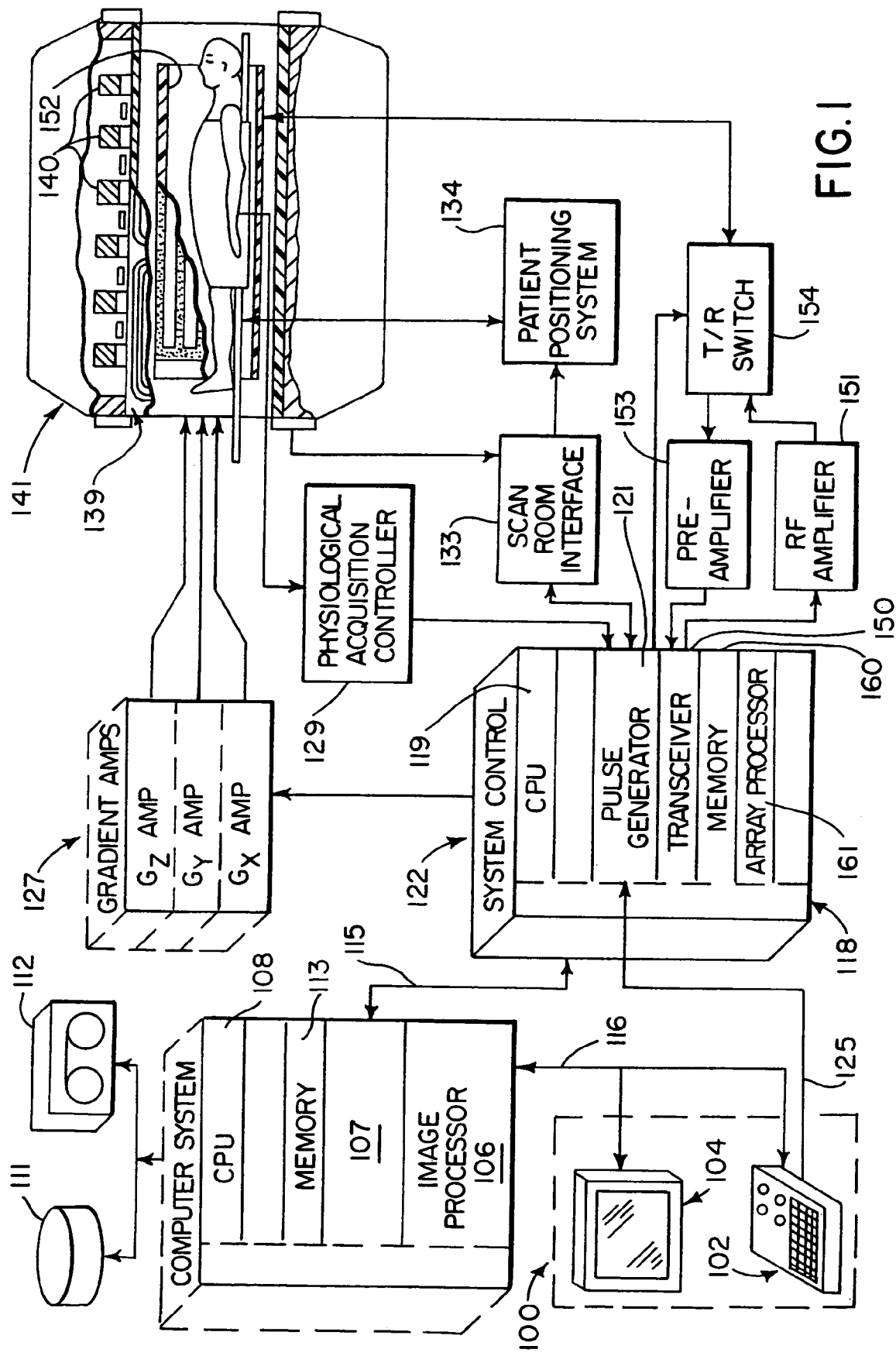
FIG. 1 is a block diagram of an MRI system which has been configured and programmed to practice the preferred embodiment of the invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113 for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system.

It is also through the scan room interface circuit 133 that a patient positioning system 134 receives commands from the pulse generator module 121 to move the patient through the scanner to perform the scan in accordance with the present invention. The current position of the table at any time during the scan is read into the system control 122 and used to phase correct the acquired NMR data as will be described in more detail below. The operator can control the operation of the patient positioning system 134 through the keyboard and control panel 102.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 4:
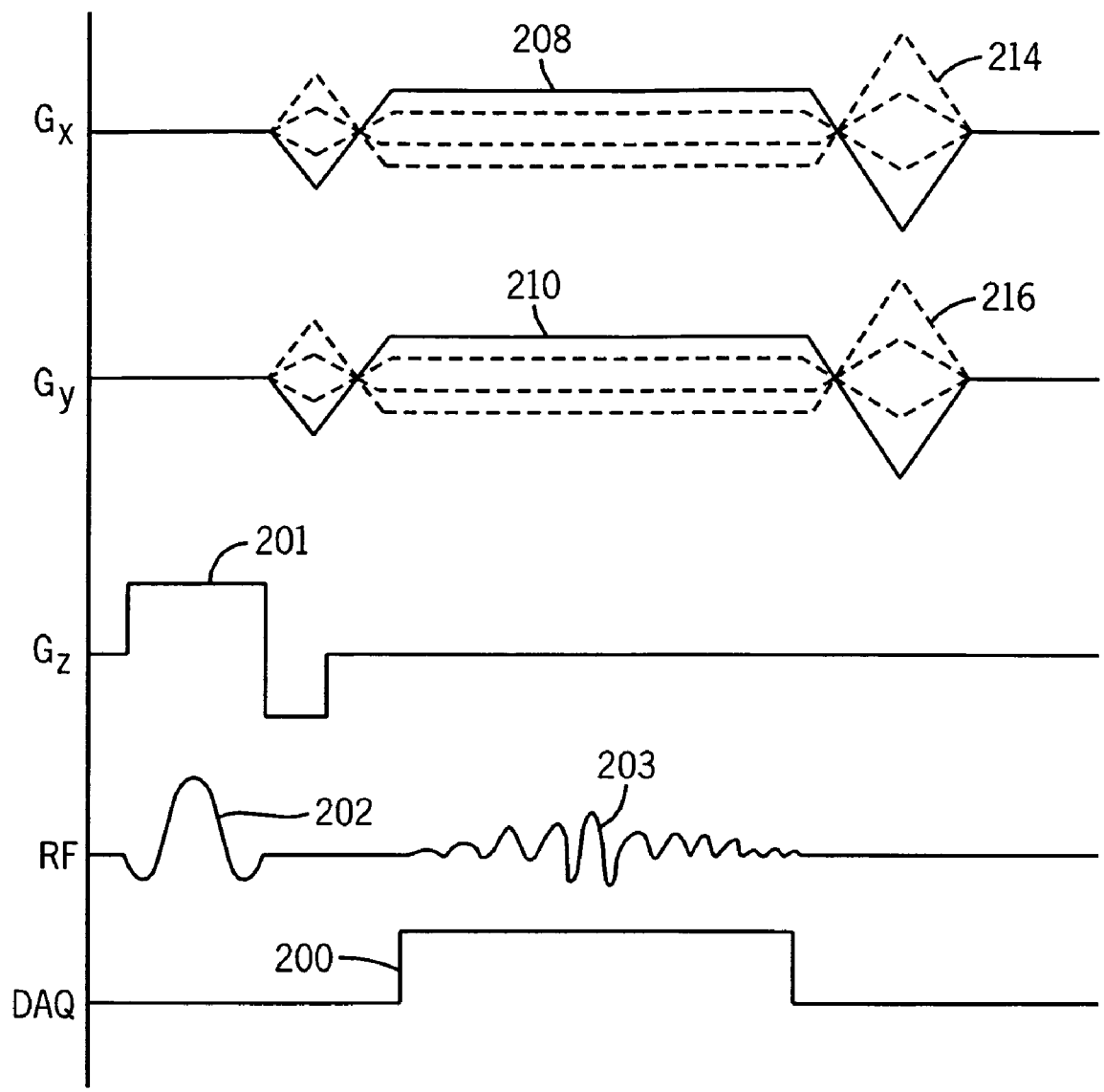
FIG. 4 is a 2D PR pulse sequence used with the MRI system of FIG. 1 to practice the preferred embodiment of the invention.

A pulse sequence used to acquire data as 2D projections is shown in FIG. 4. The sequence is implemented on the above described MRI system equipped with a high-performance gradient subsystem (40 mT/m maximum amplitude and 150 T/m/sec maximum slew rate). Either full-echo or partial-echo readouts can be performed during a data acquisition window 200. Transverse magnetization is produced in a slice by applying a selective RF excitation pulse 202 in the presence of a slice select gradient 201 directed along the z axis. A gradient-recalled NMR echo signal 203 is produced by spins in the excited slice and acquired in the presence of two readout gradients 208 and 210. The $G_x$ and $G_y$ readout gradients 208 and 210 are rewound by respective gradient pulses 212 and 214 to achieve steady state conditions during the scan. The readout gradient waveforms $G_x$, and $G_y$ are modulated during the scan to sample radial trajectories at different view angles θ as described above and shown in FIG. 7.

The 2D PR pulse sequence of FIG. 4 is a conventional pulse sequence, and to practice the present invention the only modification needed from standard practice is the order in which the projection views are acquired. Rather than changing the view angle a small amount after each projection acquisition, the view angle is incremented by approximately 45° as shown in FIG. 7.

Figure 5:
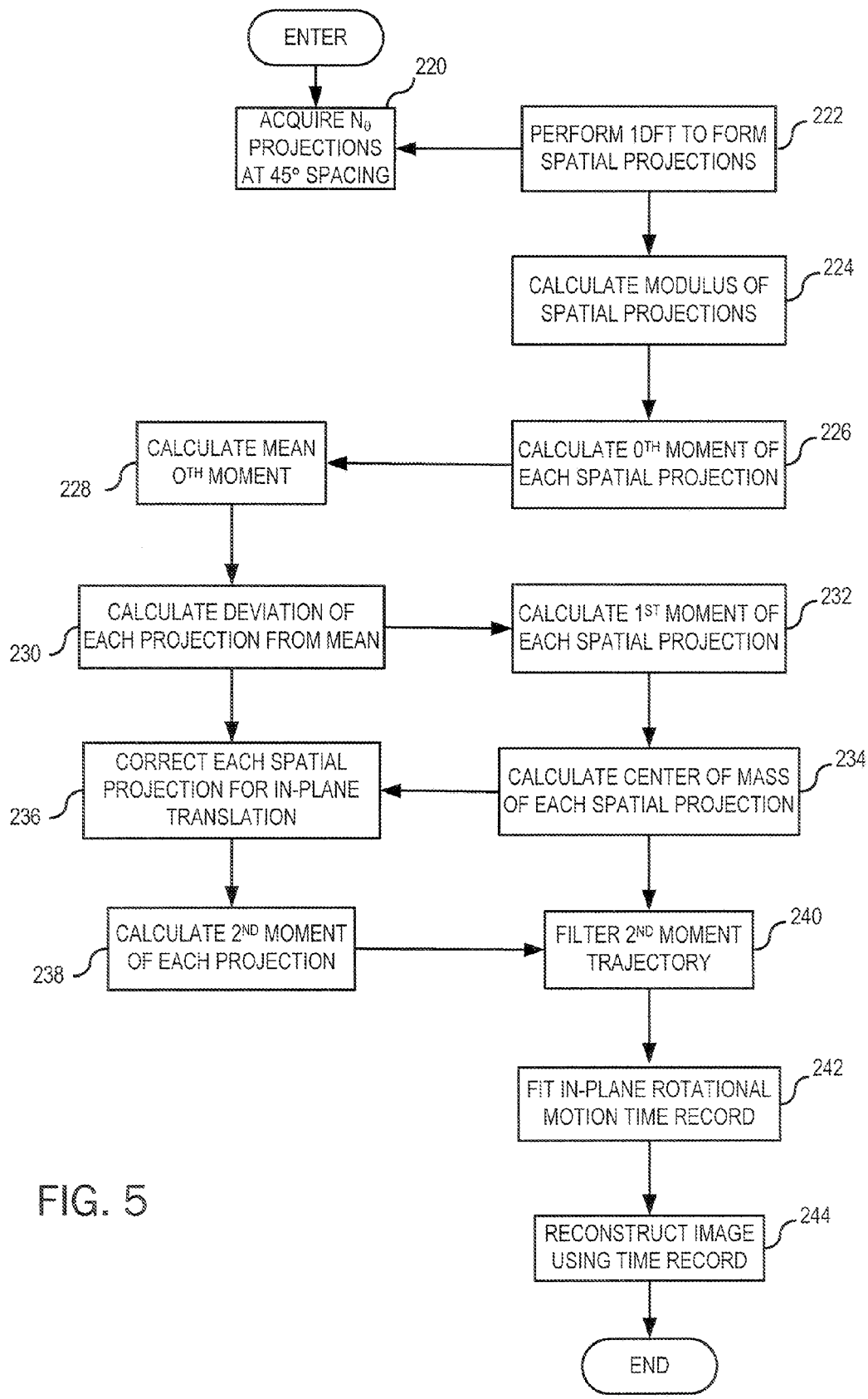
FIG. 5 is a flow chart of the steps performed by the MRI system of FIG. 1 to practice the preferred embodiment of the invention.

The steps performed to practice a preferred embodiment of the present invention are illustrated in FIG. 5. The first step as indicated by process block 220 is to perform a scan in which the prescribed number $N_θ$ of projections are acquired with the prescribed PR pulse sequence. As explained above, the successive projections are acquired at view angles θ which are spaced apart by 45 degrees. As indicated at process block 222, the next step is to Fourier transform the acquired projections to produce a corresponding set of spatial projections and then calculate the modulus ($M=\sqrt{I^2+Q^2}$) of each complex value therein as indicated at process block 224.

The 0th moment of each spatial projection is then calculated at process block 226 by summing the modulus values in each, and then a mean 0th moment is calculated at process block 228. The deviation of each spatial projection 0th moment from the mean value is then calculated at process block 230 and stored.

As indicated at process block 232, the first moment of each spatial projection is then calculated. The first moment is calculated by summing the product of each modulus in the projection and its distance (r) from the center point of the projection. As indicated at process block 234, the center of mass of each spatial projection is then calculated. The center of mass is determined by calculating the ratio of the $1^{st}$ moment over the 0th moment.

The spatial projections are then corrected for in-plane translational motion as indicated at process block 236. Each correction is made by shifting the spatial projection along r by an amount equal to its calculated center of mass. That is, each projection is shifted to align its center of mass at the same location, which is the center of the field of view in the preferred embodiment.

The second moment of each corrected spatial projection is then calculated as indicated at process block 238. The second moment is calculated by summing the product of each modulus in the corrected projection and its distance squared ($r^2$) from the center point of the projection. A $2^{nd}$ moment trajectory such as that illustrated in FIG. 6 is thus produced and stored. As indicated by process block 240, this trajectory may be filtered using a median filter to remove outliers caused by effects other than in-plane motion.

As indicated at process block 242, the next step is to calculate an in-plane rotational motion time record by inverting the $2^{nd}$ moment trajectory. As explained above, this is done by a least squares inversion in which the in-plane rotational motion time record is fit to the $2^{nd}$ moment trajectory using a weighted least squares fit where we also use the system of equations arising from Eq. (7b) constructed with the assumptions $\alpha[n] \approx \alpha[n+1]$ and $\alpha[n] \approx \alpha[n-1]$. The weight of each point in the $2^{nd}$ moment trajectory is determined by the deviation of the 0th moment from the mean for the corresponding projection, as calculated previously at process block 230. The results from the weighted least squares inversion are used with the above equation 11a) to yield the in-plane rotational motion time record.

The image is then reconstructed. The in-plane rotational motion time record is employed to alter the view angle of the translation-corrected (center of mass aligned) projections that are affected by rotational motion. The in-plane translationally corrected projections are thus further corrected for in-plane rotational motion and then used to reconstruct the image. Image reconstruction may be performed using a modified filtered back projection algorithm, which accounts for the possibility that some parts of k-space may be under-sampled and other regions may be over-sampled due to rotation. The appropriate k-space filtering and weighting may be calculated using the iterative scheme proposed by Pipe and Menon, "Sampling Density Compensation In MRI: Rational And An Iterative Numerical Solution"; *Magn. Reson. Med.* 1999;41(1):179-186, using the Kaiser Bessel window convolution kernel suggested in their work with the parameter $\zeta$ set to the size of the field of view, i.e., $\zeta^{-1}=\Delta k$.

Due to the object rotation some view angles may not be acquired during the scan. This becomes apparent as soon as the in-plane rotational motion time record $\alpha[n]$ is calculated. This may degrade the quality of the reconstructed image even after the rotational motion is accounted/corrected for. If this calculation is performed immediately, the scan can be extended in real time to acquire the missing view angles. The scan may also be extended to re-acquire projections, that based on their $0^{th}$ moments, appear to be inconsistent.

Figure 8:
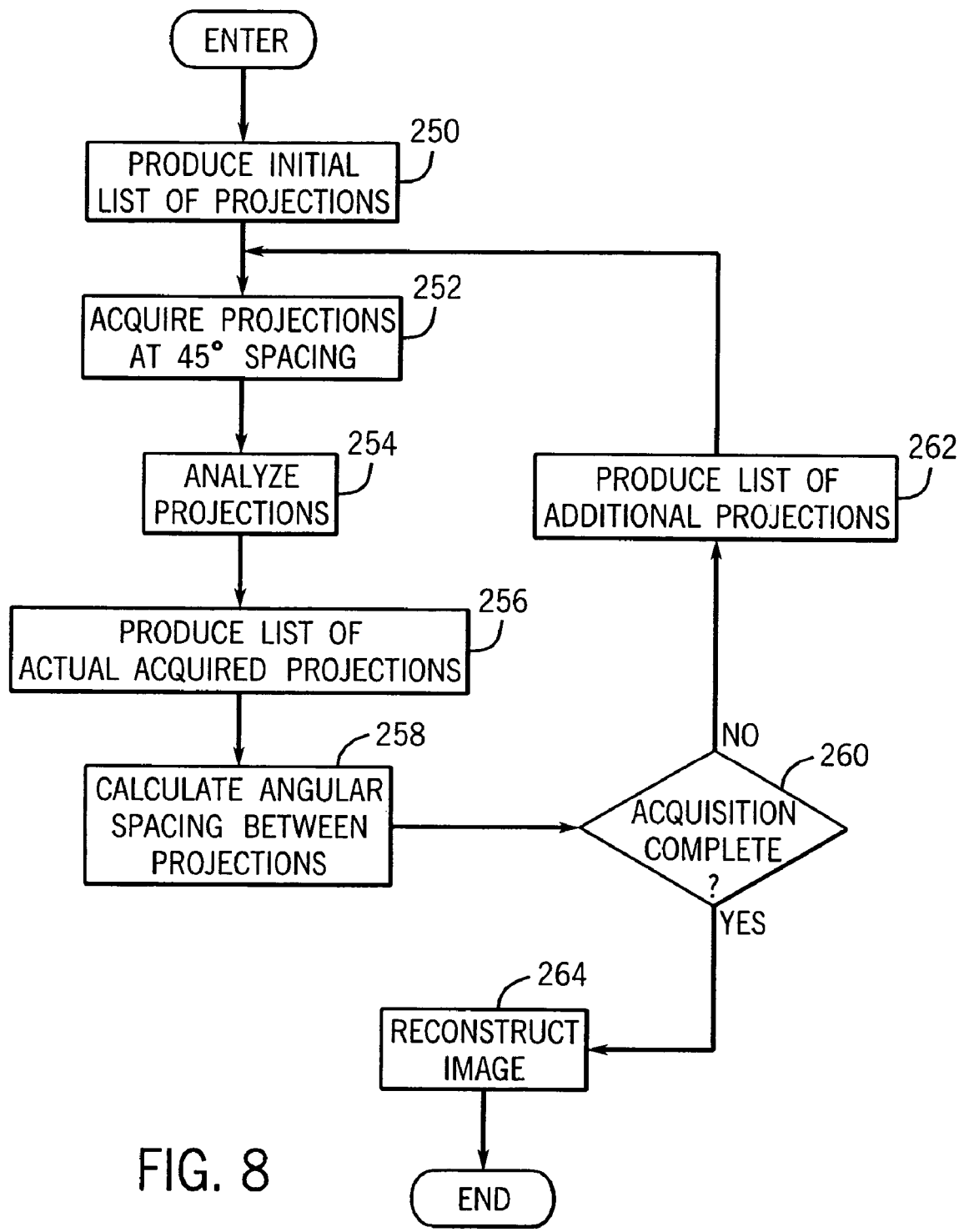
FIG. 8 is a flow chart of the steps performed by the MRI systems of FIG. 1 to practice an alternative embodiment of the invention.

Referring particularly to FIG. 8, the present invention may be employed to control the image acquisition in real time. With the real time embodiment an initial list of projection angles to be acquired is produced as indicated at 250 and those projections are then acquired as indicated at process block 252. The initial projections in this case may be the entire set of $N_\theta$ projections as described above, or it may be a subset of those projection angles.

As indicated at process block 254, all of the acquired projections are then analyzed as described above and a list of all the actual, corrected projection angles is produced as indicated at process block 256. More specifically, the steps indicated by process blocks 222 through 242 in FIG. 5 and described above are performed on the acquired projections. During this processing some of the acquired projections may be discarded due to excessive motion and others will be corrected by changing their projection angles to account for patient motion. As a result, gaps may be present in the angular spacing between acquired and corrected projections as determined at process block 258. If these gaps exceed a predetermined angle as determined at decision block 260, additional projections must be acquired in order to produce an image of the desired resolution and quality. In such case, a list of additional projections is produced as indicated at process block 262 and the system loops back to process block 252 to acquire these additional projections.

The data acquisition continues in this loop until all the angular gaps are filled as determined at decision block 260. The image is then reconstructed as indicated at process block 264 and described above.

The invention may also be extended to 3D acquisitions in which the 3-D k-space data set is acquired as a stack of 2-D slice acquisitions using the 2DPR pulse sequence of FIG. 4. True 3-D acquisitions in which the radial projections fill a 3-D sphere will not be compatible because the varying excited tissue volume in such a true 3-D acquisition introduces aliasing inconsistencies into the projection data.

We claim:

1. A method for producing an image of an object with a magnetic resonance imaging (MRI) system, the steps comprising:
    a) acquiring a projection of NMR data by performing a pulse sequence with the MRI system which samples through the center of k-space at a selected view angle;
    b) repeating step a) a plurality of times at different view angles such that the difference in view angles of successive projection acquisitions is an angle spacing that achieves sufficient linear independence;
    c) performing a one-dimensional Fourier transformation of each projection to form a plurality of spatial projections;
    d) calculating the 0th moment of each spatial projection;
    e) calculating the first moment of each spatial projection;
    f) correcting spatial projections for in-plane translational motion of the object using the calculated 0th and first moment information;
    g) calculating the second moment of each translation-corrected spatial projection;
    h) determining a rotational motion time record based on the $2^{nd}$ moments of the translation-corrected spatial projections; and i) calculating the actual projection view angles, which are perturbed by the in-plane rotational motion, using the detected rotational motion time record; and j) reconstructing an image using the translational-corrected spatial projections with a reconstruction method which incorporates the detected rotational motion time record to reconstruct the spatial projections based on their actual projection view angle.

2. The method as recited in claim 1 in which the pulse sequence is a two-dimensional projection reconstruction (2DPR) pulse sequence.

3. The method as recited in claim 2 in which the pulse sequence acquires a 3-D k-space data set as a plurality of 2-D slices.

4. The method as recited in claim 1 in which the projections acquired in step b) sample k-space substantially uniformly.

5. The method as recited in claim 1 in which step f) includes:

i) calculating the center of mass of each spatial projection using the first moment information and the 0th moment information; and ii) shifting the spatial projection by an amount determined by its center of mass.

6. The method as recited in claim 1 in which the angle spacing is substantially 45° between successive projection acquisitions.

7. The method as recited in claim 1 in which step h) includes:

vi) producing a second moment trajectory from the calculated second moments of successively acquired projections; and vii) the in-plane rotation motion time record is calculated by performing an inversion in which the in-plane rotational motion time record is fit to the second moment trajectory.

8. The method as recited in claim 7 in which the inversion is a weighted least squares fit.

9. The method as recited in claim 8 which includes:

calculating the mean 0th moment of all the acquired spatial projections;

calculating the deviation of each spatial projection 0th moment from the mean; and using the deviations in the weighted least squares fit step.

10. A method for producing an image of a subject with a magnetic resonance imaging (MRI) system, the steps comprising:

a) producing a list of projection angles to acquire;

b) acquiring projections using a projection reconstruction pulse sequence at the projection angles in the list;

c) analyzing the acquired projections to correct them for in-plane translational and rotational motion of the subject;

d) calculating the angular spacing between corrected acquired projections;

e) producing a list of projection angles to acquire that will fill gaps between corrected acquired projections;

f) repeat steps b), c), d) and e) until the gaps between corrected acquired projections are less than a preselected amount; and g) reconstruct an image with the corrected acquired projections.

11. The method as recited in claim 10 which includes:

h) detecting excessive subject motion in an acquired projection analyzed in step c); and i) adding the projection angle of the acquired projection detected in step h) to the list of projection angles to acquire.

12. The method as recited in claim 11 in which step h) is performed by calculating the $0^{th}$ moment of the acquired projection.

* * * * *